(12) United States Patent
Zhang et al.

(10) Patent No.: US 12,328,990 B2
(45) Date of Patent: Jun. 10, 2025

(54) DRIVE BACKBOARD, PREPARATION METHOD THEREOF, DISPLAY PANEL, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Yang Zhang, Beijing (CN); Liangchen Yan, Beijing (CN); Bin Zhou, Beijing (CN); Qinghe Wang, Beijing (CN); Leilei Cheng, Beijing (CN); Wei Li, Beijing (CN); Tao Sun, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 711 days.

(21) Appl. No.: 17/418,121

(22) PCT Filed: Dec. 30, 2020

(86) PCT No.: PCT/CN2020/141771
§ 371 (c)(1),
(2) Date: Jun. 24, 2021

(87) PCT Pub. No.: WO2021/136446
PCT Pub. Date: Jul. 8, 2021

(65) Prior Publication Data
US 2023/0133139 A1 May 4, 2023

(30) Foreign Application Priority Data
Jan. 2, 2020 (CN) .......................... 202010002768.8

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/1213* (2023.02); *H10K 59/80518* (2023.02); *H10K 2102/103* (2023.02)

(58) Field of Classification Search
CPC ............. H10K 59/122; H10K 59/1201; H10K 59/1213; H10K 59/80518;
(Continued)

(56) References Cited

U.S. PATENT DOCUMENTS

| 2019/0189718 A1* | 6/2019 | Lee ...................... H10K 59/131 |
| 2019/0259822 A1 | 8/2019 | Jeon et al. |

(Continued)

FOREIGN PATENT DOCUMENTS

| CN | 106848095 A | * | 6/2017 | |
| CN | 110444567 A | * | 11/2019 | ......... H01L 27/1288 |

(Continued)

OTHER PUBLICATIONS

Yi et al., Machine Translation of Foreign Patent Document CN 106848095A, Organic electroluminescent display panel, preparation method of organic electroluminescent display panel and electronic equipment, Jun. 13, 2017, pp. 1-17 (Year: 2017).*

(Continued)

*Primary Examiner* — Amr A Awad
*Assistant Examiner* — Maheen I Javed
(74) *Attorney, Agent, or Firm* — IPro, PLLC

(57) ABSTRACT

Disclosed are a preparation method thereof, a display panel, and a display device. The drive backboard comprises: a pixel circuit disposed on a base substrate; an anode disposed on a side of the pixel circuit facing away from the base substrate and electrically connected to the pixel circuit; and a first insulating layer disposed between the base substrate and the anode; the first insulating layer is provided with a groove surrounding the pixel circuit, the anode covers the first insulating layer, and an edge of the anode extends to an inner wall of the groove.

20 Claims, 4 Drawing Sheets

(51) Int. Cl.
*H10K 59/121* (2023.01)
*H10K 59/80* (2023.01)
*H10K 102/10* (2023.01)

(58) Field of Classification Search
CPC ....... H10K 2102/103; H10K 59/80515; H10K 59/126; H10K 59/123; H10K 59/124; H01L 27/1214; H01L 27/127; G09G 3/3208

See application file for complete search history.

(56) References Cited

U.S. PATENT DOCUMENTS

| | | | |
|---|---|---|---|
| 2021/0074778 A1 | 3/2021 | Li et al. | |
| 2021/0343803 A1* | 11/2021 | Cheng | H10K 59/122 |
| 2022/0271065 A1* | 8/2022 | He | H10D 86/0221 |

FOREIGN PATENT DOCUMENTS

| | | | |
|---|---|---|---|
| CN | 110571257 A | 12/2019 | |
| CN | 111162095 A | 5/2020 | |

OTHER PUBLICATIONS

Ren et al., Machine Translation of Foreign Patent Document CN 110444567A, Array substrate and manufacturing method thereof, Nov. 12, 2019, pp. 1-21 (Year: 2019).*

* cited by examiner

DRIVE BACKBOARD, PREPARATION METHOD THEREOF, DISPLAY PANEL, AND DISPLAY DEVICE

CROSS-REFERENCE OF RELATED APPLICATIONS

The present disclosure is a National Stage of International Application No. PCT/CN2020/141771, filed Dec. 30, 2020, which claims priority of Chinese patent application No. 202010002768.8, filed with the China National Intellectual Property Administration on Jan. 2, 2020, and entitled "Drive backboard, Preparation Method Thereof, Display Panel, and Display Device", the entire content of which is hereby incorporated by reference.

FIELD

The present disclosure relates to the field of display technology, and in particular to a drive backboard, a preparation method thereof, a display panel, and a display device.

BACKGROUND

In recent years, large size Organic Light-Emitting Diode, OLED, display panel has gradually become the mainstream in the development of the display industry due to advantages of a high contrast ratio, self-luminous property and the like. The top-emitting OLED display panel has gradually become the focus in the development due to a large aperture ratio. However, the top-emitting OLED display panel has a problem that ambient light entering from a side of a base substrate is reflected onto a semiconductor active layer after reflected by a reflective anode, and at the same time light is reflected between a light shield layer (Shield), a gate, and the reflective anode, and the interference due to light intensity is enhanced, resulting in deterioration of the photosensitive performance (NBTIS) of a thin film transistor (TFT).

SUMMARY

An embodiment of the present disclosure provides a drive backboard, including:
a base substrate;
a pixel circuit, disposed on the base substrate;
an anode, disposed on a side, facing away from the base substrate, of the pixel circuit and electrically connected to the pixel circuit; and
a first insulating layer, disposed between the base substrate and a layer where the anode is located;
the first insulating layer is provided with a groove surrounding the pixel circuit, the anode covers the first insulating layer, and an edge of the anode extends to an inner wall of the groove.

In some embodiments, the drive backboard further includes:
a pixel defining structure, disposed on a side, facing away from the base substrate, of the anode;
an orthographic projection of the pixel defining structure on the base substrate completely covers an orthographic projection of the groove on the base substrate, and a part of the pixel defining structure is embedded in the groove.

In some embodiments, the edge of the anode only extends to a side wall of the groove, and the anode is broken at a bottom of the groove.

In some embodiments, a cross-sectional area of the groove gradually decreases along a direction from the anode toward the base substrate.

In some embodiments, the drive backboard further includes a planarization layer disposed between a layer where the pixel circuit is located and a layer where the anode is located;
the planarization layer is provided with a first groove surrounding the pixel circuit; and
the first insulating layer includes the planarization layer, and the groove includes the first groove.

In some embodiments, the drive backboard further includes a passivation layer disposed between the layer where the pixel circuit is located and the planarization layer, the first passivation layer is provided with a second groove surrounding the pixel circuit;
the second groove is stacked under the first groove;
the first groove is a through groove running through the planarization layer;
the first insulating layer further includes the passivation layer; and
the groove further includes the second groove.

In some embodiments, the pixel circuit includes a thin film transistor, the thin film transistor includes an active layer and a source-drain electrode;
the drive backboard further includes an interlayer insulating layer disposed between a layer where the active layer is located and a layer where the source-drain electrode is located;
the interlayer insulating layer is provided with a third groove surrounding the pixel circuit;
the third groove is stacked under the second groove;
the second groove is a through groove running through the passivation layer; and
the first insulating layer further includes the interlayer insulating layer, and the groove further includes the third groove.

In some embodiments, the planarization layer is made of an SOG material or a photosensitive material.

In some embodiments, the material of the anode is Mo/Al/ITO, Al/ITO, or alloy/ITO.

An embodiment of the present disclosure further provides a display panel including the drive backboard in any of the above implementations.

An embodiment of the present disclosure further provides a display device including the above-mentioned display panel.

An embodiment of the present disclosure further provides a preparation method of a drive backboard, including the following steps:
forming a pixel circuit on a base substrate;
forming a first insulating layer on the pixel circuit, wherein the first insulating layer is provided with a groove surrounding the pixel circuit; and
forming an anode on the first insulating layer, wherein the anode covers the first insulating layer, and an edge of the anode extends to an inner wall of the groove.

In some embodiments, the forming the pixel circuit on a base substrate and the forming the first insulating layer on the pixel circuit includes:
forming an active layer, an interlayer insulating layer, a source-drain electrode, a passivation layer and a planarization layer in sequentially on the base substrate; and
forming the groove in one or more of the planarization layer, the passivation layer and interlayer insulating layer by a patterning process.

In some embodiments, the forming the groove in one or more of the planarization layer, the passivation layer and interlayer insulating layer by the patterning process includes:
  etching the planarization layer by a first exposure etching process to form a pattern of the groove; and
  in the planarization layer and the passivation layer, forming a via hole exposing the source-drain electrode by a second exposure etching process; and
  etching the pattern of the groove to deepen the via hole to the interlayer insulating layer.

In some embodiments, the preparation method further includes:
  forming a pixel defining structure disposed on the anode;
  wherein an orthographic projection of the pixel defining structure on the base substrate completely covers an orthographic projection of the groove on the base substrate, and a part of the pixel defining structure is embedded in the groove.

DETAILED DESCRIPTION OF THE EMBODIMENTS

Technical solutions in embodiments will be described below clearly and completely in conjunction with the accompanying drawings in embodiments of the present disclosure. Obviously, the described embodiments are only a part of embodiments of the present application, and not all embodiments. Based on embodiments in the present disclosure, all other embodiments obtained by those of ordinary skill in the art without any creative work fall within the protection scope of the present disclosure.

Figure 1:
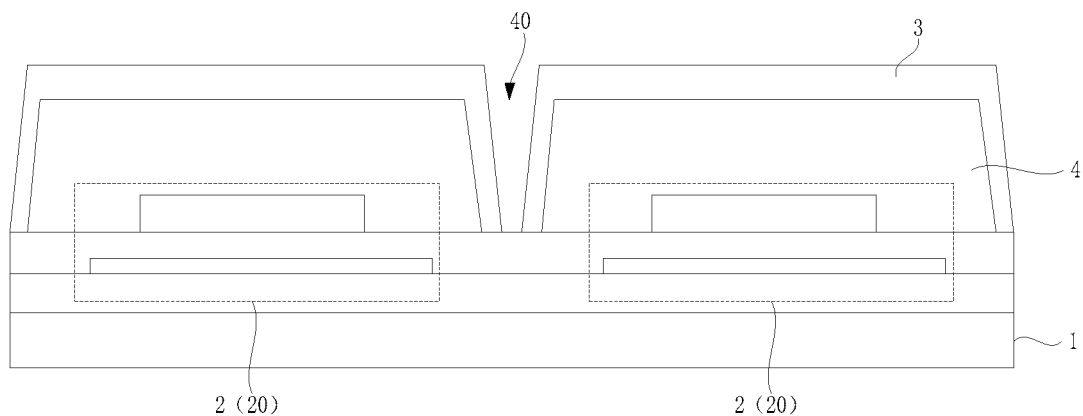
FIG. 1 is a partial sectional structure diagram of a display panel provided in an embodiment of the present disclosure.
Figure 2:
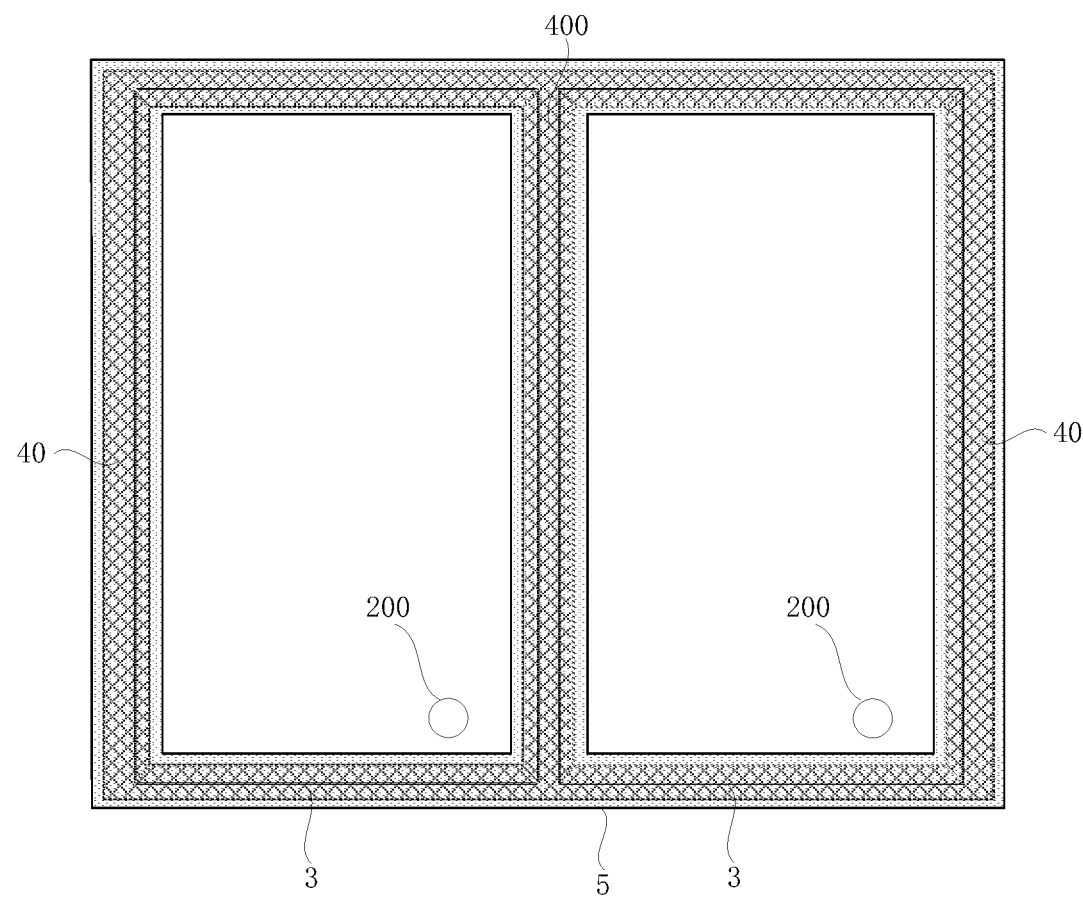
FIG. 2 is a partial top-view structure diagram of a display panel provided in an embodiment of the present disclosure.
Figure 3A:
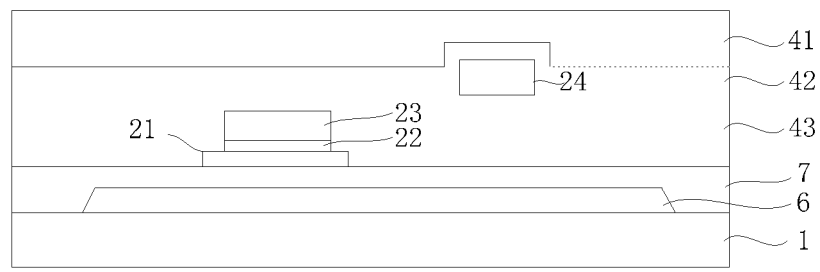
FIGS. 3A to 3I are sectional structure diagrams of a display panel provided in an embodiment of the present disclosure in different manufacturing processes, respectively.
Figure 3B:
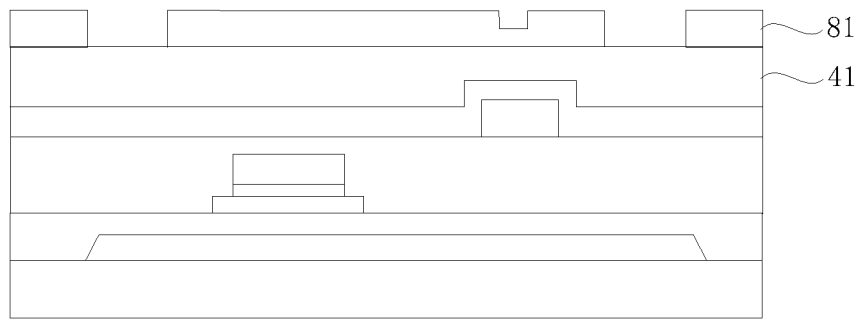
Figure 3C:
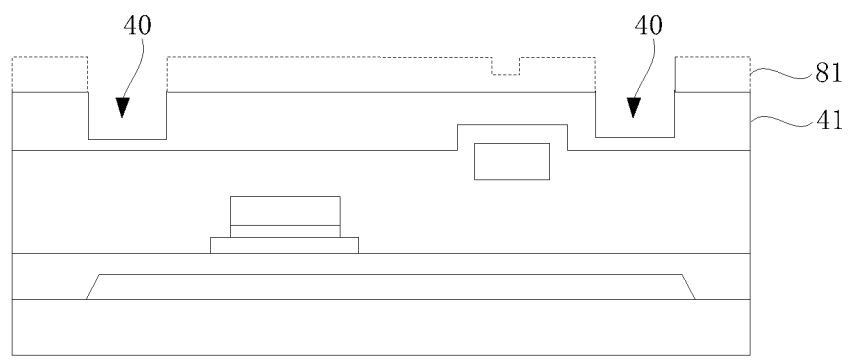
Figure 3D:
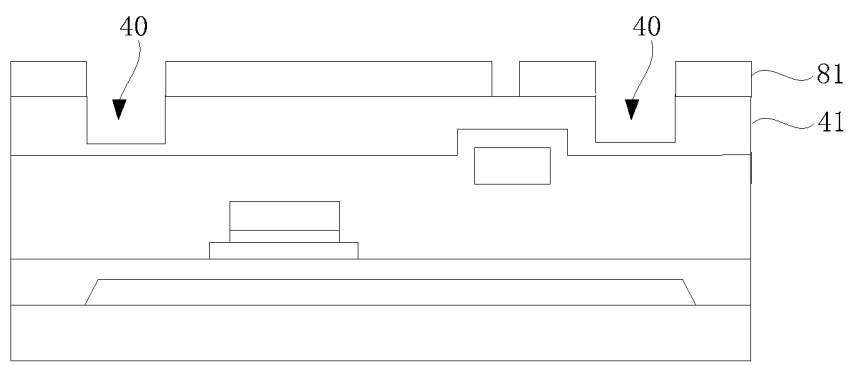
Figure 3E:
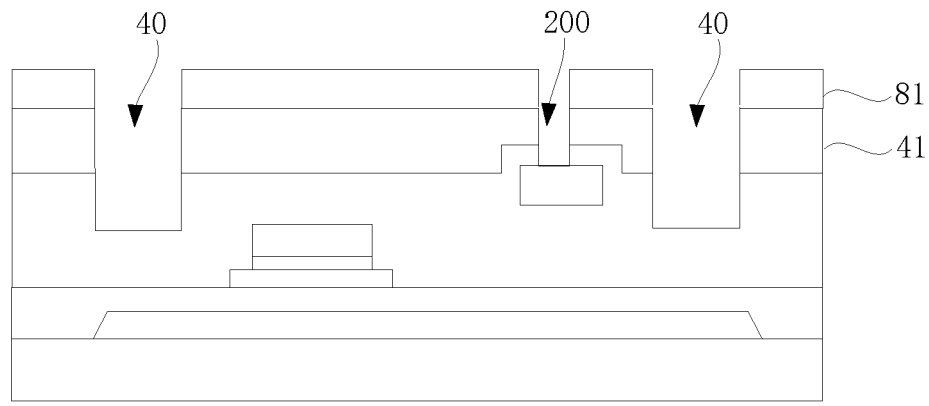
Figure 3F:
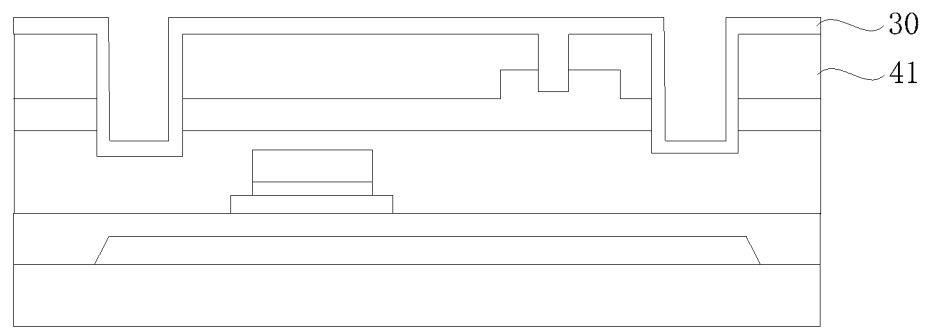
Figure 3G:
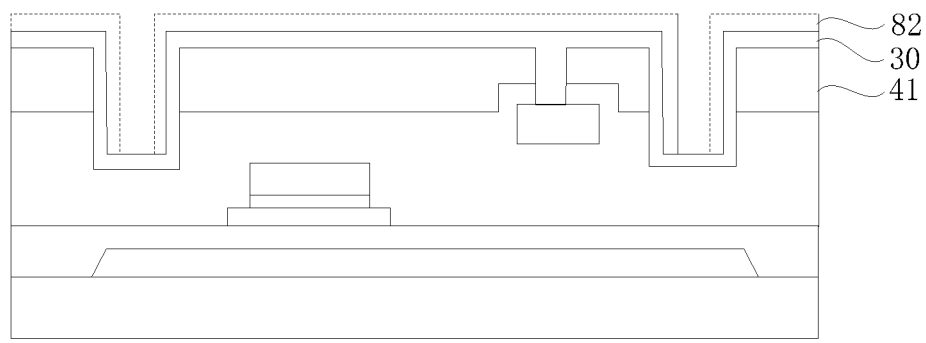
Figure 3H:
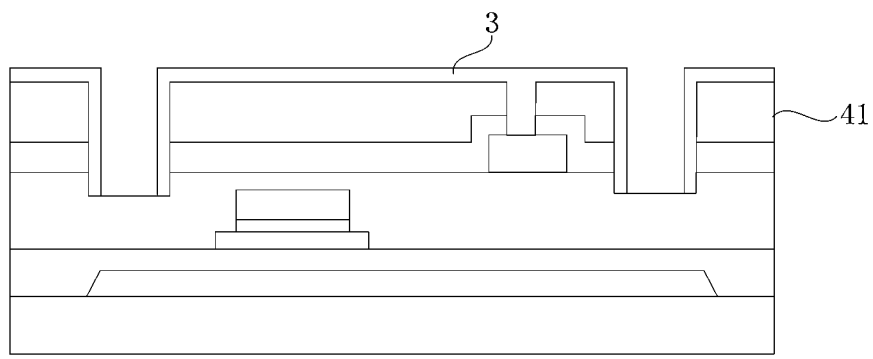
Figure 3I:
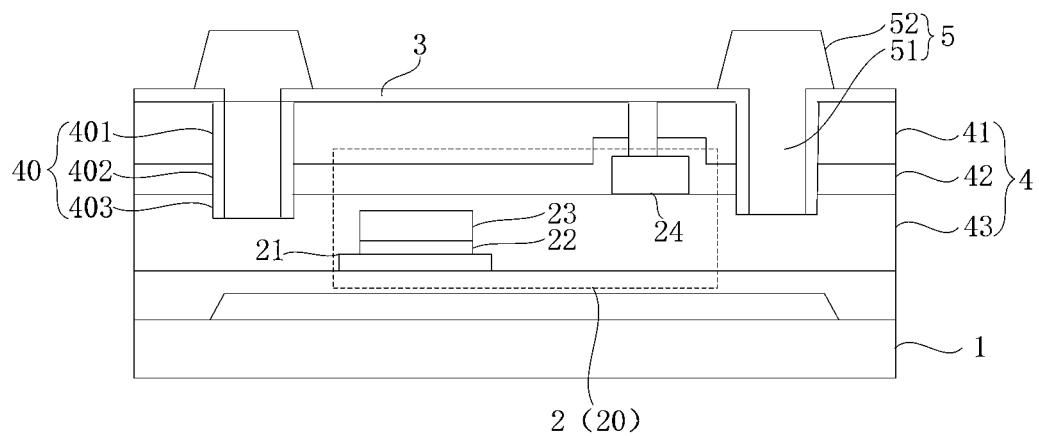

As shown in FIGS. 1, 2 and 3I, a drive backboard provided in an embodiment of the present disclosure includes:
  a base substrate 1;
  a pixel circuit 2 disposed on the base substrate 1;
  an anode 3 disposed on a side, facing away from the base substrate 1, of the pixel circuit 2 and electrically connected to the pixel circuit 2; and
  a first insulating layer 4 disposed between the base substrate 1 and a layer where the anode 3 is located, the first insulating layer 4 is provided with a groove 40 surrounding the pixel circuit 2, and the anode 3 covers the first insulating layer 4, and an edge of the anode 3 extends to an inner wall of the groove 40.

In the above-mentioned drive backboard provided in embodiment of the present disclosure, the groove 40 is provided in the first insulating layer 4 below a layer where the anode 3 is located, and the groove 40 surrounds the pixel circuit 2; and the anode 3 covers the first insulating layer 4 and has an edge extending to the inner wall of the groove 40, i.e., the edge of the anode 3 extends downward along the groove 40 and is provided around the pixel circuit 2, so that it is difficult for external light to enter the area of the pixel circuit 2 from lateral sides, thereby avoiding degradation of the photosensitive performance of a thin film transistor (TFT) 20 in the pixel circuit 2 due to light interference, effectively improving the stability of the TFT, and improving the display quality of a product. Moreover, the edge of the anode 3 extending downward along the groove 40 can increase the area of the anode 3, increase the capacitance and improve the performance of an OLED light-emitting device while ensuring that the area of an orthographic projection of the anode 3 is unchanged, and thus can improve the OLED luminous performance while ensuring a large pixel resolution.

In some embodiments, as shown in FIG. 3I, the drive backboard provided in embodiment of the present disclosure may include a planarization layer (PLN) 41 between a layer where the pixel circuit 2 is located and the layer where the anode 3 is located; the planarization layer 41 may be provided with a first groove 401 surrounding the pixel circuit 2; and the first insulating layer 4 may include a planarization layer 41, and the groove 40 may include a first groove 401.

Exemplarily, the planarization layer 41 is used to provide a planarization surface, and may be made of a silicone resin (SOG) material to achieve flatness as much as possible, or a photosensitive material, such as a photosensitive acrylic material, to facilitate patterning.

In some embodiments, the anode 3 may be disposed directly on the planarization layer 41, and the edge of the anode extends to a side wall within the first groove 401.

In some embodiments, the first groove 401 may have a bottom wall, which means that the first groove 401 does not run through the planarization layer 41; or the first groove 401 may also be a through groove running through the planarization layer 41.

In some embodiments, as shown in FIG. 3I, the drive backboard provided in the embodiment of the present disclosure may further include a passivation layer (PVX) 42 between the layer where the pixel circuit 2 is located and the planarization layer 41, and the first passivation layer 42 may be provided with a second groove 402 surrounding the pixel circuit 2 and stacked under the first groove 401.

In some embodiments, the first groove 401 may be a through groove running through the planarization layer 41. The second groove 402 may have a bottom wall, which means that the second groove 402 does not run through the passivation layer 42; or the second groove 402 may also be a through groove running through the passivation layer 42.

In some embodiments, the first insulating layer 4 may include the planarization layer 41 and the passivation layer 42, and the groove 40 may include the first groove 401 and the second groove 402. In other words, the first insulating layer 4 includes both the planarization layer 41 and the passivation layer 42, and the groove 40 in the first insulating layer 4 runs through the planarization layer 41 and into the passivation layer 42.

In some embodiments, as shown in FIG. 3I, the pixel circuit 2 in the drive backboard provided in embodiment of the present disclosure may include a thin film transistor 20, the thin film transistor 20 including an active layer 21 and a source-drain electrode 24; and the drive backboard may further include an interlayer insulating layer (ILD) 43 between a layer where the active layer 21 is located and a layer where the source/drain electrode 24 is located, and the interlayer insulating layer 43 may be provided with a third groove 403 surrounding the pixel circuit 2 and stacked under the second groove 402.

In some embodiments, the first groove 401 may be a through groove running through the planarization layer 41, and the second groove 402 may be a through groove running through the passivation layer 42. The third groove 403 may have a bottom wall, which means that the third groove 403 does not run through the interlayer insulating layer 43; or the second groove 403 may also be a through groove running through the interlayer insulating layer 43.

In some embodiments, the first insulating layer 4 may include the planarization layer 41, the passivation layer 42 and the interlayer insulating layer 43, and the groove 40 may include the first groove 401, the second groove 402 and the third groove 403. In other words, the first insulating layer 4 not only includes the planarization layer 41 and the passivation layer 42, but also includes the interlayer insulating layer 43, and the groove 40 in the first insulating layer 4 runs through the planarization layer 41 and the passivation layer 42 and into the interlayer insulating layer 43.

In some embodiments, as shown in FIGS. 2 and 3I, the drive backboard provided in embodiment of the present disclosure may further include a pixel defining structure 5, the pixel defining structure 5 is disposed on a side, facing away from the base substrate 1, of the anode 3, an orthographic projection of the pixel defining structure 5 on the base substrate 1 completely covers an orthographic projection of the groove 40 on the base substrate 1, and a part of the pixel defining structure is embedded in the groove 40.

In some embodiments, the drive backboard may have a plurality of pixel circuits, and the plurality of pixel circuits are distributed in an array. The drive backboard may have a plurality of anodes, and the plurality of anodes is distributed in an array. One pixel circuit is generally electrically connected to one anode, and the anodes may be disconnected from each other at the bottom of the groove, i.e., as shown in FIG. 1, the edges of the anodes 3 only extend to side walls of the groove 40, and the anodes 3 are broken from each other at the bottom of the groove 40.

In some embodiments, as shown in FIGS. 2 and 3I, the pixel defining structure 5 is located on the anode 3 and arranged in a grid pattern, with each grid opening corresponding to a pixel circuit 2 and exposing an anode 3.

In some embodiments, the first insulating layer 4 is provided with a grid-like groove pattern, as shown in FIG. 2, which includes a plurality of annular grooves 40 corresponding to the pixel circuits, each annular groove 40 being provided around the corresponding pixel circuit; and two adjacent annular grooves 40 may have a segment of shared groove 400, and part of edges of two adjacent anodes 3 extend into the segment of shared groove 400 and deposited on two opposite inner walls of the segment of groove 400 respectively but not in contact with each other.

In some embodiments, an orthographic projection of the above-mentioned grid-like groove pattern on the base substrate 1 is within the orthographic projections of the pixel defining structures 5 on the base substrate 1, and the material of the pixel defining structures 5 is filled within the grooves 40.

In some embodiments, as shown in FIG. 3I, the pixel defining structure 5 may include a first portion 51 within the groove 40 and a second portion 52 above the groove 40. The longitudinal section of the second portion 52 is generally in a regular trapezoid shape which is narrow at the top and wide at the bottom to define the size of a pixel area and to prevent ink from spilling out in all directions when a light-emitting device layer structure is printed.

As the pixel defining structure 5 includes the first portion 51 embedded in the groove 40, the contact area between the pixel defining structure 5 and the layer underneath is increased, which can avoid detachment, and as the pixel defining structure 5 is mainly in contact with the material layer of the anode 3 in the groove 40, the adhesion force between the pixel defining structure 5 and the anode 3 is large, and thus the problem of detachment of the pixel defining structure 5 can be further avoided.

For a print-type light-emitting device, such as an OLED, to achieve a better display effect, a printing substrate in the pixel area needs to have very high flatness. To improve the flatness, the anode 3 below the planarization layer 41 is generally made of an organosiloxane resin (SOG) material, wherein the SOG is formed by polymerization of organosiloxane containing hydroxyl groups at the periphery subjected to thermal dehydration, and has high polarity with the presence of many hydroxyl groups at the periphery. Further, to avoid that an inkjet solution spread on the top of the pixel defining structure 5 contaminates adjacent pixels and causes cross color, the pixel defining structure (Bank) 5 above the anode 3 is generally made of a fluorine-containing material, which has a hydrophobic property, low polarity, and poor adhesion to the SOG material.

In some embodiments, the pixel defining structure 5 between adjacent anodes 3 may contact the planarization layer 41 (SOG material layer), and thus is prone to problems such as detachment of the pixel defining structure 5. However, as shown in FIG. 3I, in the drive backboard provided in embodiment of the present disclosure, the edge of the anode 3 extends to the inner wall of the groove 40, and a part of the pixel defining structure 5 is embedded in the groove 40, which greatly increases the contact area between the pixel defining structure 5 and the anode 3, and reduces the relative contact area between the pixel defining structure 5 and the planarization layer 41 (SOG material layer), and thus the problem of detachment of the pixel defining structure 5 can be effectively avoided.

In some embodiments, as shown in FIG. 1, the longitudinal section of the groove 40 may be in the shape of an inverted trapezoid, i.e., the transverse sectional area of the groove 40 decreases gradually along a direction from the anode 3 toward the base substrate 1. In this way, a uniform and continuous anode material may be formed on the inner wall of the groove 40 during evaporation of the anode 3 to avoid edge breaking of the anode, and the area of the anode 3 can be increased as much as possible to increase the contact area between the anode 3 and the pixel defining structure 5, thereby improving the device performance and yield of the OLED.

In some embodiments, the material of the anode 3 may be Mo/Al/ITO, Al/ITO, or alloy/ITO.

Based on the same inventive concept, an embodiment of the present disclosure further provides a display panel including the drive backboard as described above, and a light emitting device may be provided in each grid opening of the pixel defining structure 5 of the driving backboard.

The display panel provided in embodiment of the present disclosure can avoid deterioration of the photosensitive performance of a thin film transistor (TFT) in the pixel circuit due to light interference, effectively improve the stability of the TFT in the pixel circuit, and improve the display quality of a product. Furthermore, the display panel can improve the luminous performance of an OLED while ensuring a large pixel resolution.

Based on the same inventive concept, an embodiment of the present disclosure further provides a display device including the above-mentioned display panel.

Based on the same inventive concept, an embodiment of the present disclosure further provides a preparation method of a drive backboard, the method including the following steps:

forming a pixel circuit on a base substrate;
forming a first insulating layer on the pixel circuit, wherein the first insulating layer is provided with a groove surrounding the pixel circuit; and
forming an anode on the first insulating layer, wherein the anode covers the first insulating layer, and an edge of the anode extends to an inner wall of the groove.

In some embodiments, the forming the pixel circuit on a base substrate and the forming the first insulating layer on the pixel circuit include:

forming an active layer, an interlayer insulating layer, a source-drain electrode, a passivation layer and a planarization layer in sequentially on the base substrate; and
forming the groove in one or more of the planarization layer, the passivation layer and interlayer insulating layer by a patterning process.

Exemplarily, the groove may be located only within the planarization layer, or may run through the planarization layer into the passivation layer, or may run through both the planarization layer and the passivation layer and into the interlayer insulating layer.

In some embodiments, the forming the groove in one or more of the planarization layer, the passivation layer and interlayer insulating layer by a patterning process may include:

etching the planarization layer by a first exposure etching process to form a pattern of the groove; and
in the planarization layer and the passivation layer, forming a via hole exposing the source-drain electrode by a second exposure etching process; and
etching the pattern of the groove to deepen the via hole to the interlayer insulating layer.

In some embodiments, the through groove formed in the planarization layer and the passivation layer is a groove for electrical connection between the anode and the source-drain electrode.

In some embodiments, the preparation method further includes the following steps:

preparing a pixel defining structure on a layer where the anode is located, a projection of the pixel defining structure on the base substrate completely covering a projection of the groove on the base substrate, and the pixel defining structure being partially embedded in the groove.

In some embodiments, after preparing the pixel defining structure on the base substrate, the preparation method further includes steps of preparing a light emitting device layer, an encapsulation layer, and the like to form a display panel, which are not described here.

In some embodiments, the preparation method includes the following steps.

In step 101, as shown in FIG. 3A, a light shield layer (Light Shield) 6, a buffer insulating layer (Buffer) 7, an active layer (IGZO) 21, a gate insulating layer (GI) 22, a gate (Gate) 23, an interlayer insulating layer (ILD) 43, and a source-drain electrode (SD) 24 are formed successively on a base substrate 1, and then a passivation layer (PVX) 42 and a planarization layer (PLN) 41 are deposited, wherein the planarization layer 41 is made of an SOG material. A top-gate thin film transistor is used as an example in FIGS. 3A to 3I, and the preparation method provided in the embodiment of the present disclosure is also applicable to a bottom-gate transistor, which is not be described in detail here.

In step 102, as shown in FIGS. 3B to 3C, a photoresist (PR) 81 is applied on the planarization layer 41, the PR adhesive 81 is patterned by using a halftone mask, and then the planarization layer 41 is etched by using a dry etching process to form a pattern of the groove 40.

In step 103, as shown in FIGS. 3D to 3E, the PR 81 is further patterned, and a via hole 200 is formed in the planarization layer 41 and the passivation layer 42 by using a dry etching process, while increasing the etching depth of the groove 40.

In step 104, as shown in FIGS. 3F to 3H, after the PR 81 is removed, a reflective anode material layer 30 (which may be of an Mo/Al/ITO stacked structure, an Al/ITO stacked structure or an alloy/ITO stacked structure) is deposited on the planarization layer 41, and a pattern of a reflective anode 3 is formed by applying a PR 82, exposure, development, etching and other processes, and then the PR 82 is removed.

In step 105, as shown in FIG. 3I, a layer of pixel defining structure (Bank) material is applied to the pattern of the reflective anode 3, and a pattern of a pixel defining structure 5 is formed after exposure, development and baking.

Figure 4:
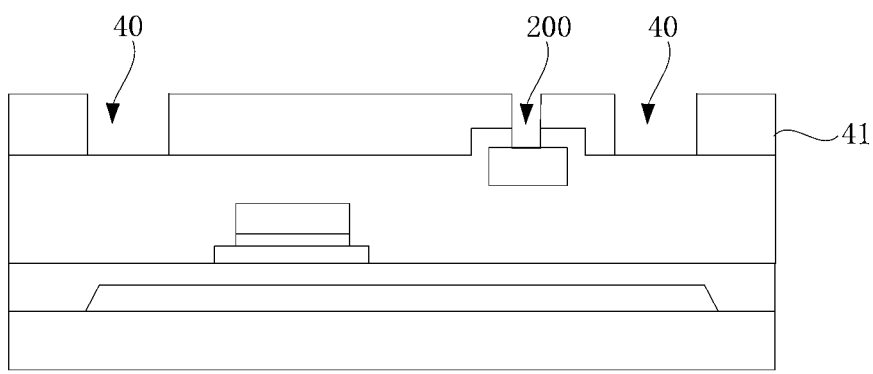
FIG. 4 is a sectional structure diagram of a display panel provided in an embodiment of the present disclosure in another manufacturing process.

In another implementation, the planarization layer 41 may be made of a photosensitive resin material (Resin), and after deposition of the planarization layer 41, preparation of a PR layer is not needed, and the via hole 200 and the groove 40 may be formed directly by exposure and development, as shown in FIG. 4. The remaining steps may be same as in the specific implementation described above.

Evidently those skilled in the art can make various modifications and variations to the embodiments of the present disclosure without departing from the spirit and scope of the embodiments of the present disclosure. Thus, the present disclosure is also intended to encompass these modifications and variations to the embodiments of the present disclosure so long as the modifications and variations come into the scope of the claims appended to the present disclosure and their equivalents.

What is claimed is:

1. A drive backboard, comprising:
   a base substrate;
   a pixel circuit, disposed on the base substrate;
   an anode, disposed on a side, facing away from the base substrate, of the pixel circuit and electrically connected to the pixel circuit; and
   a first insulating layer, disposed between the base substrate and a layer where the anode is located;
   wherein the first insulating layer is provided with a groove surrounding the pixel circuit;
   the anode covers the first insulating layer; and
   an edge of the anode extends to an inner wall of the groove;
   wherein the pixel circuit comprises a thin film transistor, the thin film transistor comprises a source-drain electrode;
   the drive backboard further comprises: a planarization layer, disposed between the source-drain electrode and a layer where the anode is located; and a passivation layer, disposed between the source-drain electrode and the planarization layer;
   the anode is disposed on a side of the source-drain electrode facing away from the base substrate, and the anode is electrically connected to the source-drain electrode by means of through holes penetrating through the planarization layer and the passivation layer;

an orthographic projection of the anode on a side wall of the groove covers an orthographic projection of the source-drain electrode on the side wall of the groove; and an orthographic projection of the anode on the base substrate covers an orthographic projection of the pixel circuit on the base substrate.

2. The drive backboard of claim 1, further comprising:

a pixel defining structure, disposed on a side, facing away from the base substrate, of the anode;

wherein an orthographic projection of the pixel defining structure on the base substrate completely covers an orthographic projection of the groove on the base substrate; and a part of the pixel defining structure is embedded in the groove.

3. The drive backboard of claim 1, wherein the edge of the anode only extends to a side wall of the groove, and the anode is broken at a bottom of the groove.

4. The drive backboard of claim 1, wherein a cross-sectional area of the groove gradually decreases along a direction from the anode toward the base substrate.

5. The drive backboard of claim 1, wherein the planarization layer is provided with a first groove surrounding the pixel circuit; the first insulating layer comprises the planarization layer; and the groove comprises the first groove.

6. The drive backboard of claim 5, wherein the passivation layer is provided with a second groove surrounding the pixel circuit;

the second groove is stacked under the first groove;

the first groove is a through groove running through the planarization layer;

the first insulating layer further comprises the passivation layer; and the groove further comprises the second groove.

7. The drive backboard of claim 6, wherein the thin film transistor further comprises an active layer;

the drive backboard further comprises an interlayer insulating layer disposed between a layer where the active layer is located and a layer where the source-drain electrode is located, the interlayer insulating layer is provided with a third groove surrounding the pixel circuit;

the third groove is stacked under the second groove;

the second groove is a through groove running through the passivation layer;

the first insulating layer further comprises the interlayer insulating layer; and the groove further comprises the third groove.

8. The drive backboard of claim 5, wherein a material of the planarization layer comprises an SOG material or a photosensitive material.

9. The drive backboard of claim 1, wherein a material of the anode is Mo/Al/ITO, Al/ITO, or alloy/ITO.

10. A display panel, comprising the drive backboard of claim 1.

11. A display device, comprising the display panel of claim 10.

12. A preparation method of a drive backboard, comprising:

forming a pixel circuit on a base substrate;

forming a first insulating layer on the pixel circuit, wherein the first insulating layer is provided with a groove surrounding the pixel circuit; and forming an anode on the first insulating layer, wherein the anode covers the first insulating layer, and an edge of the anode extends to an inner wall of the groove;

wherein the pixel circuit comprises a thin film transistor, the thin film transistor comprises a source-drain electrode;

the drive backboard further comprises: a planarization layer, disposed between the source-drain electrode and a layer where the anode is located; and a passivation layer, disposed between the source-drain electrode and the planarization layer;

the anode is disposed on a side of the source-drain electrode facing away from the base substrate, and the anode is electrically connected to the source-drain electrode by means of through holes penetrating through the planarization layer and the passivation layer;

an orthographic projection of the anode on a side wall of the groove covers an orthographic projection of the source-drain electrode on the side wall of the groove; and an orthographic projection of the anode on the base substrate covers an orthographic projection of the pixel circuit on the base substrate.

13. The preparation method of claim 12, wherein the forming the pixel circuit on a base substrate and the forming the first insulating layer on the pixel circuit comprise:

forming an active layer, an interlayer insulating layer, a source-drain electrode, a passivation layer and a planarization layer in sequentially on the base substrate; and forming the groove in one or more of the planarization layer, the passivation layer and interlayer insulating layer by a patterning process.

14. The preparation method of claim 13, wherein the forming the groove in one or more of the planarization layer, the passivation layer and interlayer insulating layer by the patterning process comprises:

etching the planarization layer by a first exposure etching process to form a pattern of the groove; and in the planarization layer and the passivation layer, forming a via hole exposing the source-drain electrode by a second exposure etching process; and etching the pattern of the groove to deepen the via hole to the interlayer insulating layer.

15. The preparation method of claim 12, further comprising:

forming a pixel defining structure disposed on the anode;

wherein an orthographic projection of the pixel defining structure on the base substrate completely covers an orthographic projection of the groove on the base substrate, and a part of the pixel defining structure is embedded in the groove.

16. The display panel of claim 10, further comprising:

a pixel defining structure, disposed on a side, facing away from the base substrate, of the anode;

wherein an orthographic projection of the pixel defining structure on the base substrate completely covers an orthographic projection of the groove on the base substrate; and a part of the pixel defining structure is embedded in the groove.

17. The display panel of claim 10, wherein the edge of the anode only extends to a side wall of the groove, and the anode is broken at a bottom of the groove.

18. The display panel of claim 10, wherein a cross-sectional area of the groove gradually decreases along a direction from the anode toward the base substrate.

19. The display panel of claim 10,
wherein the planarization layer is provided with a first groove surrounding the pixel circuit; the first insulating layer comprises the planarization layer; and
the groove comprises the first groove.

20. The display panel of claim 19,
wherein the passivation layer is provided with a second groove surrounding the pixel circuit;
the second groove is stacked under the first groove;
the first groove is a through groove running through the planarization layer;
the first insulating layer further comprises the passivation layer; and
the groove further comprises the second groove.

\* \* \* \* \*